United States Patent
Zhao et al.

(10) Patent No.: US 9,257,480 B2
(45) Date of Patent: Feb. 9, 2016

(54) METHOD OF MANUFACTURING PHOTODIODE DETECTORS

(71) Applicant: General Electric Company, Schenectady, NY (US)

(72) Inventors: Ri-an Zhao, Schenectady, NY (US); Kwang Hyup An, Rexford, NY (US); Guatam Parthasarathy, Niskayuna, NY (US); Aaron Judy Couture, Schenectady, NY (US); Jie Jerry Liu, Niskayuna, NY (US); William Andrew Hennessy, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 61 days.

(21) Appl. No.: 14/144,253

(22) Filed: Dec. 30, 2013

(65) Prior Publication Data
US 2015/0187837 A1    Jul. 2, 2015

(51) Int. Cl.
| H01L 51/00 | (2006.01) |
| H01L 27/148 | (2006.01) |
| H01L 27/146 | (2006.01) |
| H01L 27/30 | (2006.01) |

(52) U.S. Cl.
CPC .... *H01L 27/14812* (2013.01); *H01L 27/14643* (2013.01); *H01L 27/14692* (2013.01); *H01L 27/307* (2013.01); H01L 27/308 (2013.01)

(58) Field of Classification Search
None
See application file for complete search history.

(56) References Cited

U.S. PATENT DOCUMENTS

| 5,399,884 A * | 3/1995 | Wei .................... H01L 27/14643 257/291 |
| 6,303,943 B1 | 10/2001 | Yu et al. |
| 7,605,875 B2 | 10/2009 | Baek et al. |
| 7,956,332 B2 | 6/2011 | Burr et al. |
| 8,300,125 B2 | 10/2012 | Ng et al. |
| 8,343,779 B2 | 1/2013 | Burgi et al. |
| 8,477,125 B2 | 7/2013 | Park et al. |
| 2004/0085598 A1 | 5/2004 | Kokeguchi et al. |
| 2005/0236614 A1 * | 10/2005 | Parker ................. H01L 51/0003 257/40 |
| 2007/0295973 A1 * | 12/2007 | Jinbo .................. H01L 27/1214 257/88 |
| 2008/0278068 A1 | 11/2008 | Huang et al. |
| 2010/0102300 A1 * | 4/2010 | Burroughes ........ H01L 27/3246 257/40 |
| 2010/0155578 A1 * | 6/2010 | Matsumoto ....... H01L 27/14632 250/216 |
| 2010/0224784 A1 * | 9/2010 | Homma .................... G01T 1/20 250/368 |
| 2011/0042656 A1 * | 2/2011 | Burroughes ........ H01L 27/3246 257/40 |
| 2011/0049661 A1 | 3/2011 | Maehara et al. |

OTHER PUBLICATIONS

PCT Search Report and Written Opinion from corresponding PCT Application No. PCT/US2014/054558 dated Nov. 20, 2014.

(Continued)

*Primary Examiner* — Benjamin Sandvik
*Assistant Examiner* — Herve Assouman
(74) *Attorney, Agent, or Firm* — Robert M. McCarthy

(57) ABSTRACT

A radiation detector assembly including an organic photodetector that generate charge in response to an incident radiation, a thin film transistor array including a plurality of pixels. The plurality of pixels may produce electric signals corresponding to the charge generated by the organic photodetector. The radiation detector assembly also includes a spacer disposed on the thin film transistor array. The spacer surrounds one or more pixels and may confine the organic photodetector within the surrounded one or more pixels such that the surrounded one or more pixels are electrically isolated from a neighboring pixel.

23 Claims, 6 Drawing Sheets

(56) References Cited

OTHER PUBLICATIONS

Kao, et al., "Fabrication of organic light-emitting devices on flexible substrates using a combined roller imprinting and photolithograph y-patterning technique, Journal of Vacuum Science & Technology B: Microelectronics and Nanometer Structures," IEEE, May 2006, pp. 1278-1282, vol. 24, Issue 3.

* cited by examiner

US 9,257,480 B2

METHOD OF MANUFACTURING PHOTODIODE DETECTORS

BACKGROUND

The subject matter disclosed herein relates to organic photodiode detectors.

Organic photodiode (OPD) detectors are used in a variety of imaging contexts (e.g., molecular and optical imaging systems). For example, OPD detectors may be used in cameras and medical imaging applications such as computed tomography, positron emission tomography, magnetic resonance imaging, and many others. In such systems, radiation (e.g., UV light, infra-red light, X-ray, etc.) generally impinges upon an array of radiation detector elements of the OPD detector that generates readable signals in response to the impinging radiation. In certain detectors, a scintillator converts the radiation to lower energy optical photons suitable for detection by the provided photodetection elements. Each of the detector elements then produces a separate electrical signal indicative of the amount of radiation at the particular location of the element. The electrical signals are collected, digitized and transmitted to a data processing system for analysis and further processing to reconstruct an image.

Generally, the OPD detectors are manufactured by non-selectively coating one or more OPD layers onto a thin film transistor (TFT) array, resulting in a continuous OPD layer. As such, pixels within the TFT array are linked to each other by the OPD layer. This may lower detector performance and reliability. For example, because of the continuous OPD layer over scan lines and data lines, capacitance loading to data and/or scan lines of the TFT array may be increased. Increased capacitance loading to data and/or scan lines may be undesirable, causing increased electronic noise, reduced image quality. Moreover, multiple pixels may be affected by diffusion of environmental components (e.g., moisture, air, oxygen, etc.). In addition, the manner in which the OPD layers are deposited onto the TFT array results in peripheral areas of the OPD detector (e.g., areas outside the TFT array) to also be coated. As such, the excess coating may need to be removed to expose the peripheral areas (e.g., interconnection layers). Removal of the excess OPD coating in the peripheral areas may damage the OPD layers on the TFT array. Accordingly, a need exists to develop OPD detectors having patterned OPD layers that isolate each individual pixel within the TFT array.

BRIEF DESCRIPTION

Certain embodiments commensurate in scope with the originally claimed subject matter are summarized below. These embodiments are not intended to limit the scope of the claimed subject matter, but rather these embodiments are intended only to provide a brief summary of possible forms of the invention. Indeed, the present disclosure may encompass a variety of forms that may be similar to or different from the embodiments set forth below.

In one embodiment, a radiation detector assembly is provided. The radiation detector assembly includes an organic photodetector that may generate charge in response to an incident radiation, a thin film transistor array including a plurality of pixels. The plurality of pixels may produce electric signals corresponding to the charge generated by the organic photodetector. The radiation detector assembly also includes a spacer disposed on the thin film transistor array. The spacer surrounds one or more pixels and may confine the organic photodetector within the surrounded one or more pixels such that the surrounded one or more pixels are electrically isolated from a neighboring pixel.

In another embodiment, a radiation detector assembly is provided. The radiation detector assembly includes an organic photodetector that may generate charge in response to an incident radiation, a thin film transistor array including a plurality of pixels. The plurality of pixels may produce electric signals corresponding to the charge generated by the organic photodetector. The radiation detector assembly also includes a spacer disposed along the plurality of pixels adjacent to a peripheral region of the thin film transistor array. The spacer surrounds the plurality of pixels at least in one dimension and confines the organic photodetector to the thin film transistor array.

In another embodiment, a method is provided. The method includes depositing a spacer around at least one pixel on a thin film transistor array and coating an organic photodetector onto at least a portion of the thin film transistor array. The organic photodetector coating is constrained by the spacer such that the photodetector is not continuous between pixels at least in one dimension.

In a further embodiment, a radiation detector system is provided. The radiation detector assembly includes an organic photodiode detector that may generate charge in response to an incident radiation, a thin film transistor array including a plurality of pixels. The plurality of pixels may produce electric signals corresponding to the charge generated by the photodetector. The radiation detector assembly also includes a spacer disposed on the thin film transistor. The spacer surrounds at least one pixel and may confine the organic photodetector within at least one pixel such that at least one pixel is electrically isolated from neighboring pixels. The radiation detector system further includes circuitry that may process the electric signals produced by the plurality of pixels to reconstruct an image of an object to be imaged.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
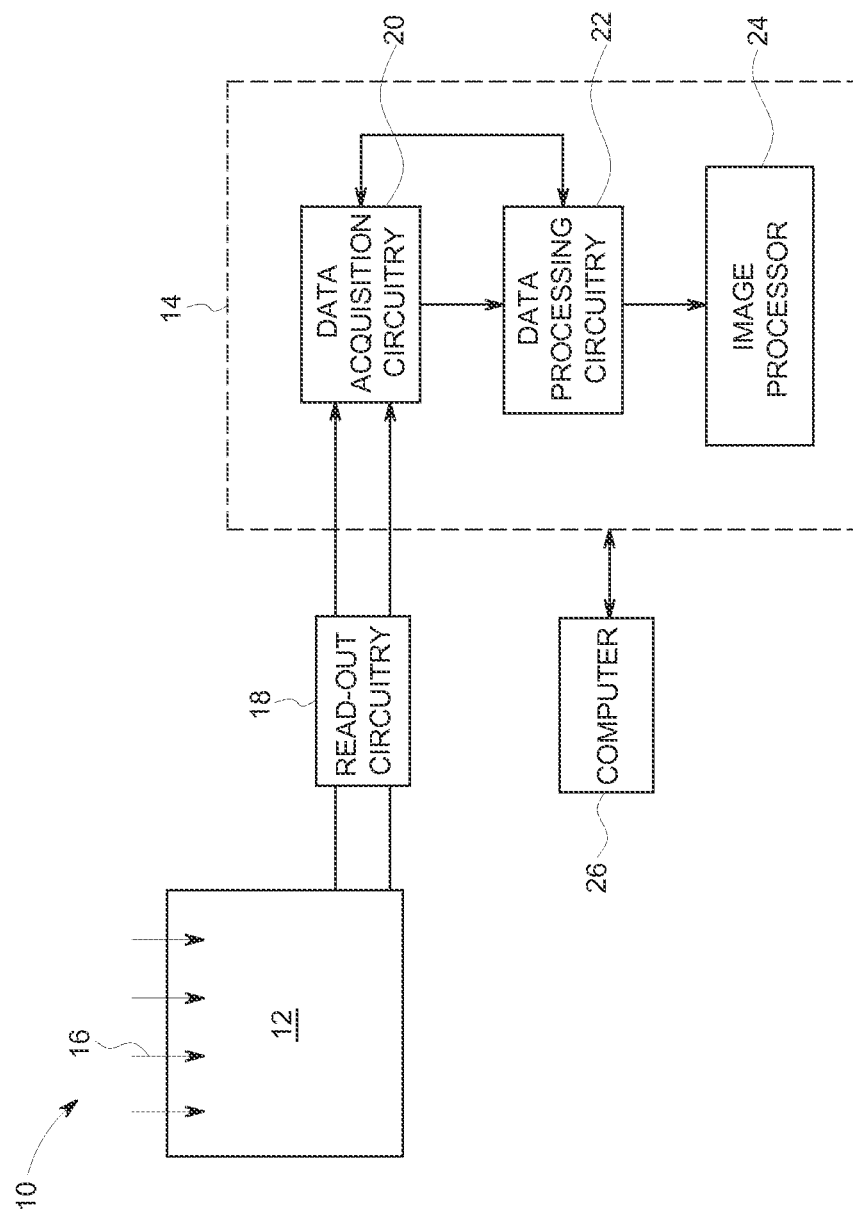
FIG. 1 is a block diagram of an embodiment of a radiation detector system including a photodetector assembly.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

Conventional approaches used to produce organic photodiode (OPD) detectors generally result in continuous non-patterned OPD layers. Because the continuous non-patterned OPD layers couple pixels within the TFT array to each other, a damaged pixel may have a significant impact on the performance and reliability of neighboring pixels. In addition, capacitance loading to the data and scan lines of each pixel may be increased. Therefore, it may be desirable to isolate the pixels from each other.

To overcome these and other shortcomings of existing approaches, present embodiments utilize spacers to generate OPD detectors having a patterned OPD layer. Generally, the separators may provide boundaries within the OPD layers to isolate each individual pixel from a neighboring pixel within the TFT array. In certain implementations, the TFT array may include wetting and non-wetting regions to facilitate patterning of the OPD layers onto each pixel. For example, present embodiments include manufacturing a portion of the OPD detector with a dielectric spacer and/or self-assembled monolayers (SAM) to create the non-wetting regions on a surface of the TFT array.

It may be desirable to manufacture OPD detectors in this manner to pattern the OPD layer onto the surface of the TFT array without using costly and complex techniques such as photolithography. In addition, each individual pixel within the TFT array may be isolated from other pixels. Therefore, in situations where a pixel becomes damaged (e.g., due to moisture or oxygen), neighboring pixels may be unaffected. Moreover, capacitance coupling to underlying data or scan lines for each pixel may be minimized. This may improve the OPD detectors overall performance and reliability.

Turning now to FIG. 1, a block diagram of a radiation detector system 10 for use in an imaging system is illustrated. In the depicted embodiment, the radiation detector system 10 includes a photodetector assembly 12 and a control and processing circuitry 14. During imaging, incoming radiation 16 (e.g., X-rays, gamma-rays, visible light, etc.) impinge the photodetector assembly 12, such as after emanating from or being attenuated by a subject or object undergoing imaging. In certain embodiments, the photodetector assembly 12 may include an element (e.g., scintillator) that absorbs the radiation 16 (e.g., gamma or X-ray photons) and in response emits light of a characteristic wavelength, thereby releasing the absorbed energy. The released energy (e.g., the emitted light) may be detected by other elements (e.g., an organic photodiode) of the photodetector assembly 12 to generate electrical signals corresponding to the incident radiation 16.

The electrical signals generated by the photodetector assembly 12 are, in the depicted example, acquired by readout circuitry 18 of the control and processing circuitry 14. Similarly, in this example, the signals from the readout circuitry 18 are acquired by the data acquisition circuitry 20. In the depicted embodiment, the acquired signals are supplied to data processing circuitry 22 and/or to image processing circuitry 24. The data processing circuitry 22, when present, may perform various functions such as gain correction, edge detection, sharpening, contrast enhancement, and so forth to condition the data for subsequent processing or image reconstruction. The image processing circuitry or image processor 24 may in turn process the acquired signals to generate an image for a region of interest (ROI) based on the detected radiation 16. In the depicted embodiment, the control and processing circuitry 14 may be controlled by or implemented in a computer 26, which may include or be in communication with an operator workstation and/or an image display workstation. For example, an operator workstation may be utilized by a system operator to provide control instructions to some or all of the components that aid in image generation. The operator workstation may also display the generated image in a remote location, such as on a separate image display workstation.

While in the illustrated embodiment, the control and processing circuitry 14 is depicted external to the photodetector assembly 12, in certain implementations, some or all of these circuitries may be provided as part of the photodetector assembly 12. Likewise, in certain embodiments some or all of the circuitry present in the control and processing circuitry 14 may be provided as part of a computer 26 such as may be embodied in an imaging workstation of operator workstation. Thus, in certain embodiments, aspects of the readout circuitry 18, data acquisition circuitry 20, data processing circuitry 22, image processing circuitry 24, as well as other circuitry of the control and processing circuitry 14, may be provided as part of the photodetector assembly 12 and/or as part of a connected computer 26.

Figure 2:
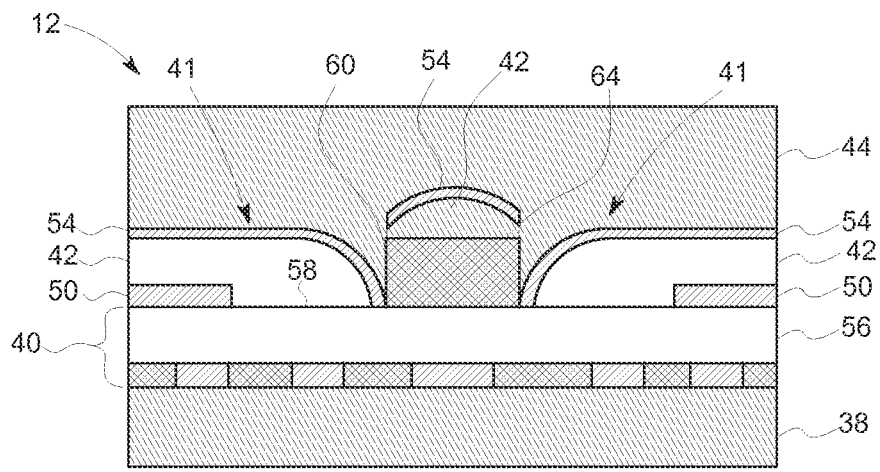
FIG. 2 is a side view of an embodiment of the photodetector assembly of FIG. 1 including a dielectric spacer.

FIG. 2 illustrates an embodiment of the photodetector assembly 12 that may be utilized in the radiation detector system 10. The photodetector assembly 12 includes a series of layers that each facilitates detection of incident radiation on the radiation detector system 10. For example, the photodetector assembly 12 may include a substrate 38, a thin film transistor (TFT) layer 40, a photodetector 42, and a scintillator layer 44. The photodetector assembly 12 may also include a first electrode 50 and a second electrode 54 that provide a flow of electrical charges generated in response to incident radiation throughout the photodetector assembly 12. In the illustrated embodiment, the photodetector 42, also referred to as a photodiode or organic photodiode (OPD), may be fabricated over the TFT array 40 disposed over the substrate 38. However, in other embodiments, the photodetector 42 may be fabricated over the scintillator layer 44. For example, in situations where the scintillator layer 44 is deposited over the substrate 38. The substrate 38 may be composed of rigid or flexible materials such as glass, plastic, metals, or combinations thereof. For example, the substrate 38 may include materials such as, but not limited to, glass, polyethylene terephthalate, polybutylene phthalate, polyethylene naphthalate, polystyrene, polycarbonate, polyether sulfone, polyallylate, polyimide, polycycloolefin, norbornene resins, fluropolymers, stainless steel, aluminum, silver, gold, and metal oxides (e.g., titanium oxide and zinc oxide), semiconductors (e.g., silicon or organic), or any other suitable material.

To facilitate discussion of the photodetector assembly 12, reference will only be made to embodiments where the photodetector 42 is deposited over the TFT array 40. Accordingly, after processing the substrate 38 (e.g., surface cleaning), the TFT array 40 may be fabricated onto the substrate 38. The TFT array 40 may be a two dimensional array of passive or active pixels that may each store charge generated by the photodetector 42. The stored charge may be transferred from each pixel 41 (e.g., via readout circuitry 18) for further processing and image reconstruction. The TFT array 40 may also include a passivation layer 56 to protect the components of the TFT array 40 (e.g., gate, source lines, data lines, etc.) from environmental components (e.g., moisture, air, oxygen, etc) and/or reactions with the photodetector 42.

After deposition of the TFT array 40, the first electrode (e.g., an anode or a cathode) may be disposed over the TFT array 40 and patterned to each pixel or selectively disposed over each individual pixel. For example, the first electrode 50 may be deposited as a thin film via physical vapor deposition, sputtering, or any other suitable technique. In certain embodiments, a shadow mask may be employed during deposition of the first electrode 50 to define an array of first contact pads (e.g., first electrode 50) on each pixel 41 of the TFT array 40. The first contact pads may be deposited onto the entire surface of each pixel 41. In other embodiments, the first contact pads may be patterned onto each pixel 41, forming a lateral offset and/or vertical offset between the first contact pad and data readout lines on the TFT array 40. The first contact pads may include transparent or semi-transparent conductive oxides. For example, in embodiments where the first contact pad is a cathode, materials such as, but not limited to, gold, silver, indium tin oxide (ITO), indium zinc oxide (IZO), aluminum zinc oxide (AZO), tin oxide, titanium oxide, any other suitable conductive metal oxide, or combinations thereof may be used. In embodiments where the first contact pad is an anode, materials such as, but not limited to, aluminum, gold, silver, platinum, ITO, IZO, zinc oxide, organic conductors (e.g., p-doped conjugated polymers), any other suitable material, or combinations thereof may be used.

As discussed above, the photodetector 42 may be deposited over the TFT array 40. However, prior to receiving the photodetector 42, a surface 58 of the TFT array 40 may be patterned and/or primed to facilitate selective deposition of the photodetector 42. In the illustrated embodiment, the surface 58 may include a dielectric spacer 60. The dielectric spacer 60 may border each pixel 41 on the TFT array 40, and therefore, electronically isolate each pixel 41 from neighboring pixels. For example, during deposition of the photodetector 42, the dielectric spacer 60 may interrupt the continuous deposition of the photodetector 42. This may promote selective deposition of the photodetector 42 onto the TFT array 40, and each pixel 41 may be individually encapsulated by the second electrode 54 or additional barrier coatings. In addition, the dielectric spacer 60 may provide protection to moisture sensitive pixels within the TFT array 40. For example, the dielectric spacer 60 may have low moisture permeability properties. As should be appreciated, the dielectric spacers 60 may be deposited onto the surface 58 before or after deposition of the first electrode 50.

In certain embodiments, the dielectric spacer 60 may overlap with data lines and/or scan lines of the TFT array 40. For example, the dielectric spacer 60 may be disposed on top of the data lines and/or scan lines. In other embodiments, the dielectric spacer 60 may be the passivation layer 56 or a portion of a passivation layer corresponding to (adjacent to or directly overlying) the data and/or scan lines. By overlapping the dielectric spacer 60 over the data and or scan lines, a distance between electrical lines (e.g., data and scan lines) of the TFT array 40 and the second electrode 54 may be increased. As such, the capacitance loading to data lines and or scan lines may be reduced.

The dielectric spacer 60 may be any suitable inorganic or organic dielectric material or combinations thereof. The dielectric spacer 60 may include multiple layers of dielectric materials. For example, in one embodiment, the dielectric spacer 60 may include multiple layers of inorganic or organic dielectric materials. In other embodiments, the dielectric spacer 60 may include separate and distinct layers of dielectric materials. For example, the dielectric spacer 60 may include one or more layers of an inorganic dielectric material followed by one or more layers of a compositionally different dielectric material (e.g., inorganic or organic).

The dielectric spacer 60 may be coupled to the surface 58 by any suitable physical or chemical bonding techniques. In one embodiment, the dielectric spacer 60 may be deposited over TFT array 40 and patterned to a desired area using, for example, photolithography and etching techniques. In other embodiments, the dielectric spacer 60 may be selectively deposited onto desired areas of the TFT array 40 by, for example, coating or printing layers of dielectric material onto the TFT array 40. Any suitable dielectric material may be used to form the dielectric spacer 60, including, but not limited to, silicon oxide, silicon nitride, silicon oxynitride, polymethyl methacrylate (PMMA), polyimide, SU-8 photoresist, other polymeric materials, or any combinations thereof. Other suitable dielectric materials include inorganic fluorides such as LiF, NaF, KF, $AlF_3$, $BaF_2$, $CaF_2$, and organofluorine compounds and polymers such as polytetrafluoroethylene (PTFE), polyvinylidene fluoride (PVDF and polyvinyl fluoride (PVF).

Surface modification of the dielectric spacer 60 may also facilitate patterning the photodetector 42 onto the TFT array 40. For example, a surface 64 of the dielectric spacer 60 may be treated with surface modifying components to create wetting and/or non-wetting regions on the surface 64. Suitable surface modification processes that may be utilized may include, but are not limited to, plasma treatment or self-assembled monolayers (SAM). The surface modification may change a surface energy of the surface 64, creating the non-wetting regions. For example, in one embodiment, surface modification of the surface 64 may result in a low surface energy. In one embodiment, the surface energy of the surface 64 may be approximately less than 30 mN/m. This may cause the photodetector 42 to repel (e.g., pool away) from the dielectric spacer 60. Accordingly, the photodetector 42 may be contained within the boundaries of the dielectric spacer 60, and the dielectric spacer60 may be void of any OPD layers (e.g., photodetector 42). In other embodiments, the surface 64 may be coated with the photodetector 42, as illustrated in FIG. 2. As should be appreciated, side walls of the dielectric spacer 60 may have a low surface energy and may cause the photodetector 42 to pool away such that the photodetector42 on the surface 64 and within each pixel 41 does not form a continuous coating.

In addition to surface modification of the surface 64, the dielectric spacer 60 may be shaped to provide a desired topography and pattern on the TFT array 40 and to facilitate the photodetector 42 to pool away from the dielectric spacer 60 and form non-continuous individual pixels. For example, the dielectric spacer 60 may have a cross-section that is rectangular, square, trapezoidal, triangular, dome shaped, or any other suitable shape. The dielectric spacer 60 may be shaped before, during, or after fabricating the TFT array 40, depending on the technique used to form the dielectric spacer 60 on the TFT array 40. The dielectric spacer 60 may also have a thickness of approximately between 100 nanometers to 100 micrometers.

Figure 3:
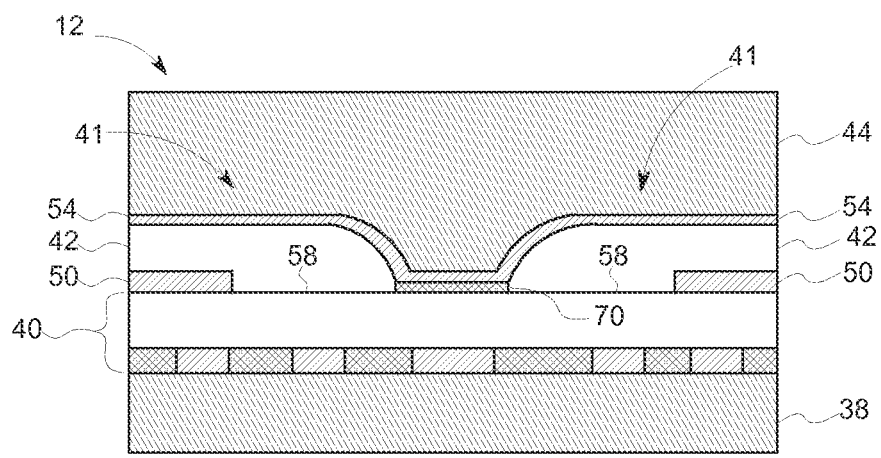
FIG. 3 is a side view of an embodiment of the photodetector assembly of FIG. 1 including a self-assembled monolayer.

In other embodiments, the photodetector assembly 12 may not include the dielectric spacer 60. Turning now to FIG. 3, an alternative embodiment of the photodetector assembly 12 having a self-assembled monolayer (SAM) 70 disposed on the surface 58 of the TFT array 40 is illustrated. Similar to the dielectric spacer 60, the SAM 70 may surround and isolate each pixel 41 within the TFT array 40. The SAM 70 may be designed to create non-wetting regions around each pixel 41, and therefore, interrupt the continuous coating of the photodetector 42. Accordingly, the photodetector 42 may be patterned on the TFT array 40. Deposition of the SAM 70 around each pixel 41 may be done via any suitable technique such as selective deposition or selective removal of SAM 70 on the surface 58, for example, using photolithography, microcontact printing, etc. The SAM 70 may include organosilanes such as, but not limited to, octadecyltrichlorosilane (OTS), aminopropyl silane (APS), 3-(2-aminoethylamino)propyltrimethodysilane (EDAS), 1H,1H,2H,2H-perfluorodecyltrichlorosilane (ETAS), any other suitable organosilane self-assembled monolayers, or combinations thereof. As should be appreciated, similar to the dielectric spacer 60, the SAM 70 may overlap with data and/or scan lines, form the passivation layer 56, or the passivation corresponding to data and/or scan lines.

After deposition of the dielectric spacer 60 or the SAM 70, the photodetector 42 may be coated onto the TFT array 40. Suitable coating techniques may include, but are not limited to, spin coating, inkjet printing, gravure printing, dip coating, or slot die coating. To facilitate discussion, reference will only be made to the dielectric spacer 60. As discussed above, the coating of the photodetector 42 may be interrupted by the dielectric spacer 60. Accordingly, patterning of the photodetector 42 on the TFT array 40 may be facilitated and each pixel 41 may be isolated from other pixels. The photodetector 42 may include one or more materials that produce charged carriers between the first electrode 50 and the second electrode 54 following the absorption of light (e.g., photons released by the scintillator layer 44). For example, the photodetector 42 may include at least one donor material such as, but not limited to, copper phtalocyanine (CuPc), (6,6)phenyl-C61-butyric acid methyl ester (PCBM), and low bandgap polymers having LUMO (lowest unoccupied molecular orbital) levels ranging from approximately 1.9 eV to approximately 4.9 eV and HOMO (highest occupied molecular orbital) levels ranging from approximately 2.9 eV to approximately 7.0 eV, or combinations thereof. In addition to the donor material, the photodetector 42 may also include an acceptor material such as, but not limited to, 3,4,9,10-perylene tetracarboxylic bisbenzimidazole (PTCBI), poly(2-methoxy-5-(3',7' dimethyloctyloxy) 1,4, phenylene-vinylene (MDMO-PPV), fullerene derivatives, fluorine copolymers, or combinations thereof. The photodetector 42 may also include hybrid structures having both organic components, such as poly-phenylene-vinylene derivatives, and inorganic nanocrystal materials, such as cadmium selenide (CdSe) or zinc telluride (ZnTe). The electron donor and acceptor materials may be deposited as discrete layers or blended together. Additionally, the photodetector 42 may also include sub-layers such as electron or hold blocking layers, electron or hole transport layers etc., that may absorb the photons and transport the electric charge through the photodetector 42.

Figure 4:
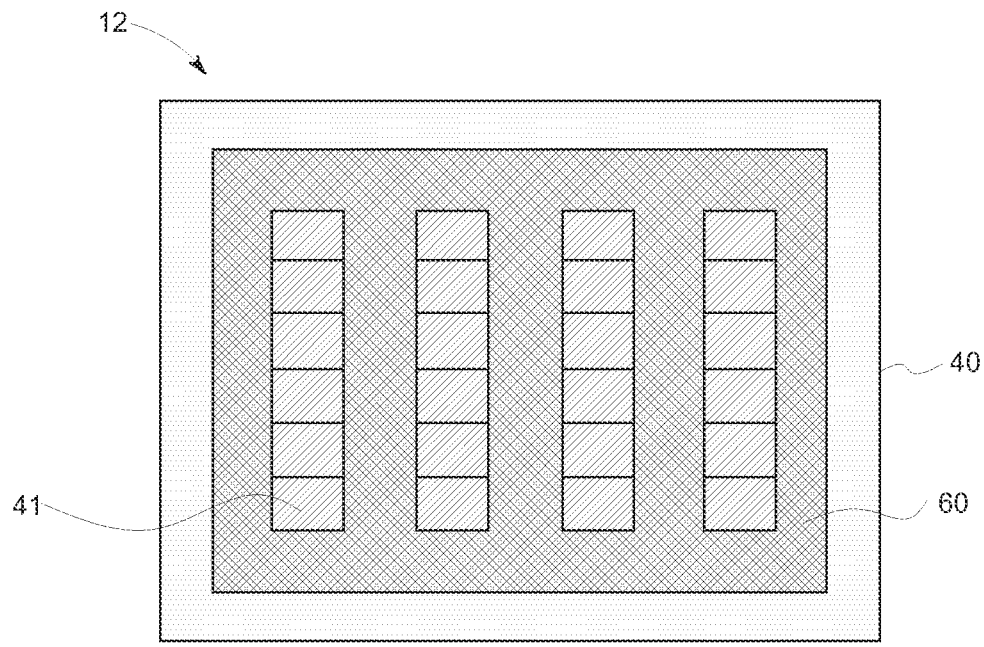
FIG. 4 is a partial top view of an embodiment of the photodetector assembly of FIG. 1 including a thin film transistor array having a cluster of isolated pixels.

In certain embodiments, the dielectric spacer 60 may isolate a group of pixels on the TFT array 40. For example, the dielectric spacer 60 may isolate 2, 3, 4, 5, 6, or more pixels. As such, the photodetector 42 may encapsulate a group of pixels (e.g., pixel 41) to form clusters of electronically coupled pixels on the TFT array 40. For example, as illustrated in FIG. 4, a top view of the photodetector assembly 12 having clusters of pixels (e.g., pixel 41) isolated by the dielectric spacer 60 on the TFT array 40. While the illustrated embodiment illustrates the pixels isolated in rows or columns, the pixels may also be isolated in sections having two or more rows, columns, or combinations thereof of the pixels.

Figure 5:
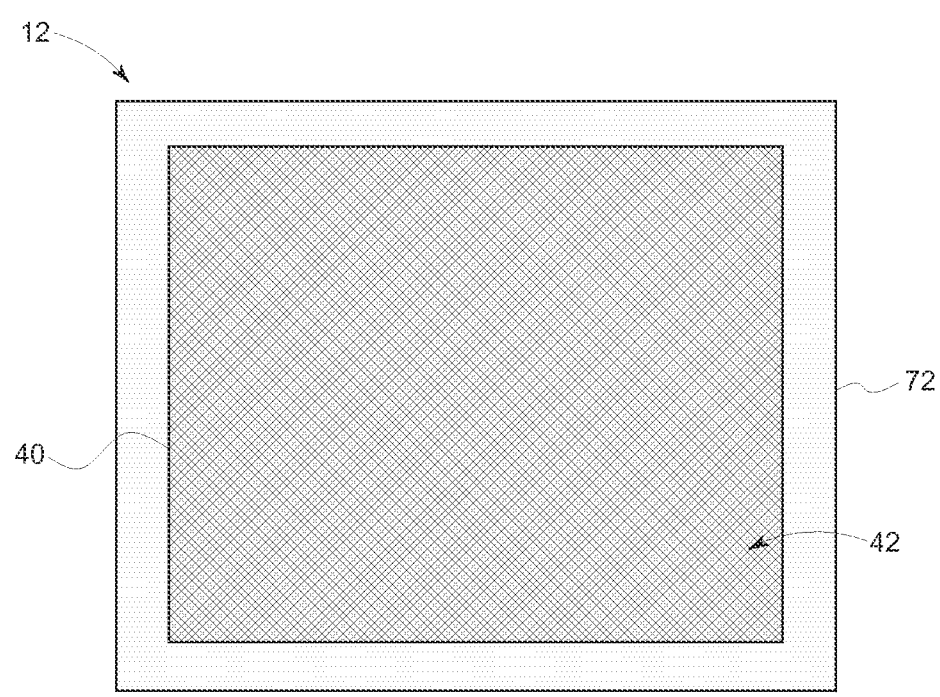
FIG. 5 is a partial top view of an embodiment of the photodetector assembly including a dielectric spacer surrounding a thin film transistor array.

In other embodiments, the dielectric spacer may border the TFT array 40. For example, FIG. 5 illustrates the TFT array 40 surrounded by a dielectric border 72. During coating of the photodetector 42, the dielectric border 72 may confine the photodetector 42 to the TFT array 40 such that the photodetector 42 is not disposed in regions outside the TFT array 40. Accordingly, peripheral regions (regions outside the TFT array 40) of the photodetector assembly may be void of the photodetector 42. In certain embodiments, the photodetector 42 may coat peripheral regions of the TFT array 40 and may need to be removed. The dielectric border 72 may facilitate removal of the photodetector 42 in the peripheral regions, as will be discussed in further detail below with reference to FIG. 7. In the illustrated embodiment, the dielectric border 72 is continuous around the TFT array 40, however, in other embodiments the dielectric border 72 may only border certain portions of the TFT array 40. The dielectric border 72 may also be a SAM (e.g., the SAM 70) or may be coated with a SAM, as described above with reference to an embodiment of the dielectric spacer 60 in FIG. 2.

Figure 6:
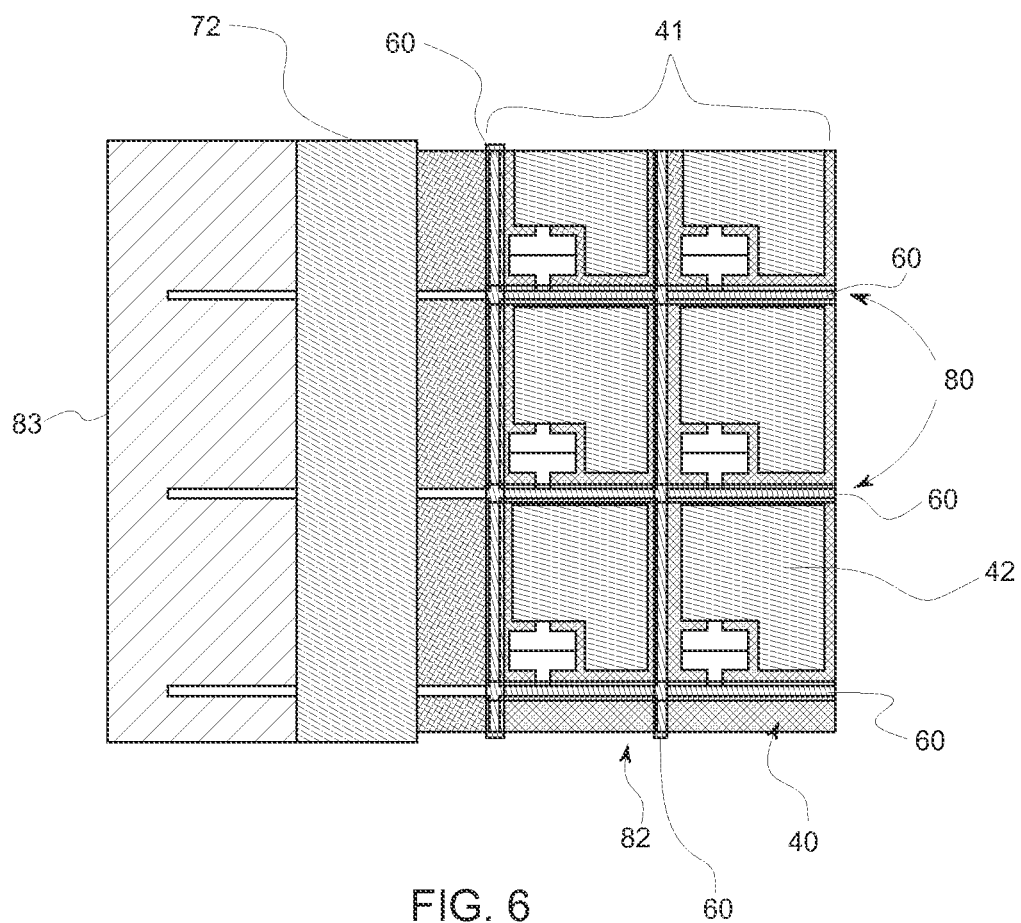
FIG. 6 is a partial top view of an embodiment of a portion of the photodetector assembly of FIG. 5.

In addition to the dielectric border 72, the TFT array 40 may also include the dielectric spacer 60 to electronically isolate the pixels (e.g., pixel 41). FIG. 6 illustrates a portion of the photodetector assembly 12 having both the dielectric spacer 60 and the dielectric border 72 on the TFT array 40. As discussed above, the dielectric spacer 60 may isolate each individual pixel 41 or a cluster of pixels. Other components of the TFT array 40 such as TFT 76, data lines 80, and scan lines 82 corresponding to each pixel (e.g., pixel 41) may be buried underneath the passivation layer 56 (not shown). In one embodiment, the dielectric spacer 60 and the dielectric border 72 may be fabricated from the same dielectric material. In other embodiments, the dielectric spacer 60 and the dielectric border 72 may be fabricated from different dielectric materials. As should be appreciated, in certain embodiments the SAM 70 may isolate the pixels and the dielectric border 72 may surround the TFT array 40. Similarly, the pixels may be isolated by the dielectric spacer 60 and a SAM may act as the dielectric border 72 and surround the TFT array 40. Additionally, the dielectric border 72 may have approximately the same or different dimensions (e.g., thickness) as the dielectric spacer 60.

Figure 7:
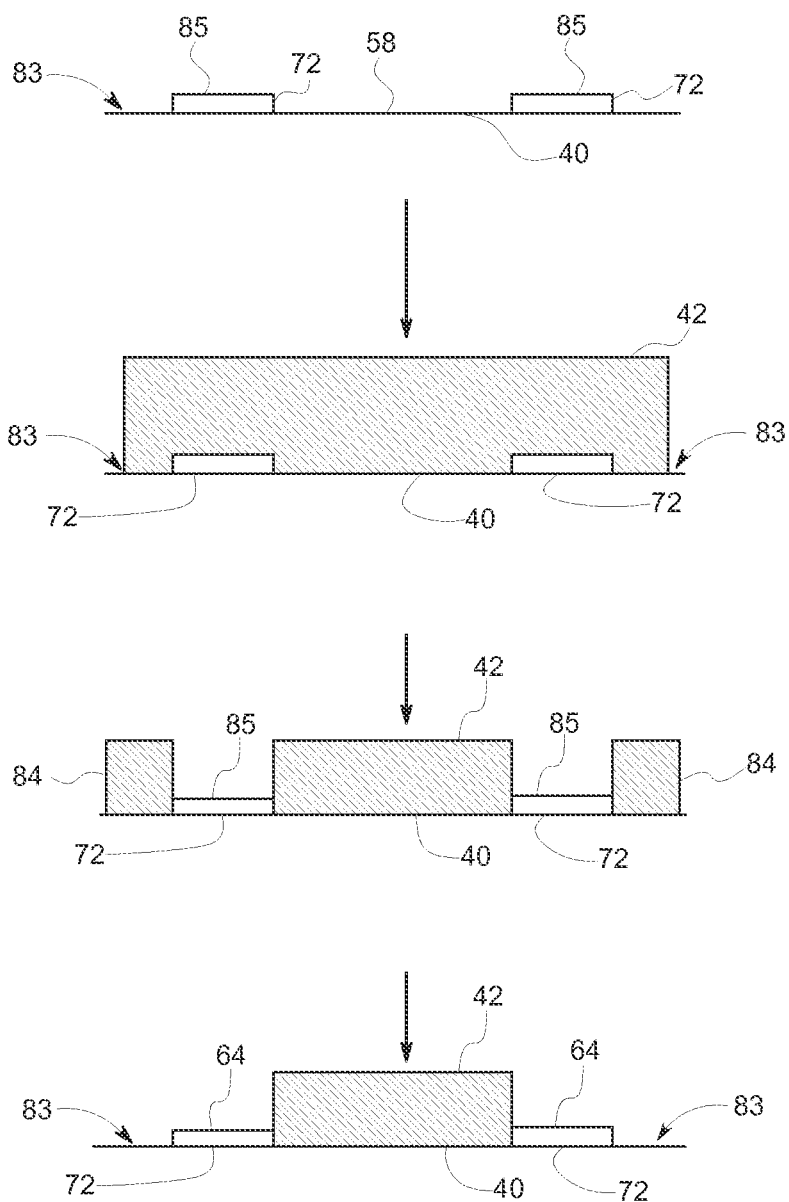
FIG. 7 is a diagrammatical illustration of an embodiment of a photodetector confined to a thin film transistor array of the photodetector assembly of FIG. 5.

As discussed above, in certain embodiments the photodetector 42 may coat a peripheral region of the TFT array 40 (e.g., regions outside the TFT array 40). The photodetector 42 may need to be removed to expose a surface of the peripheral regions. The dielectric border 72 may facilitate removal of the photodetector 42 in the peripheral regions of the TFT array 40. For example, as illustrated in FIG. 7, a peripheral region 83 is well separated from the surrounding pixels by the dielectric border 72. Accordingly, removal of an excess photodetector 84 from the peripheral region 83 may be done using any suitable technique without damaging the photodetector 42 within the surrounding pixels.

Similarly, surface modification of the dielectric border 72 may create a low surface energy (e.g., non-wetting) on a surface 85 and promote cohesion of the photodetector 42 during coating. For example, the surface 85 may have a surface energy of approximately less than 30 mN/m. Therefore, due to cohesion of the photodetector 42, the photodetector 42 may be self-contained within the boundaries of the dielectric border 72. The photodetector 42 may pool away from the surface 85 of the dielectric border 72 and the peripheral region 83 may be void of the photodetector 42. As such, removal of the photodetector 42 from the peripheral region 83 may not be necessary. Although a portion of the dielectric border 72 may be coated with the photodetector 42, the low surface energy of the surface 85 may cause the photodetector 42 to separate from the dielectric border 72 during drying, and confine the photodetector 42 to the TFT array 40. As should be appreciated, the SAM 70 may also confine the photodetector 42 in a similar manner.

Figure 8:
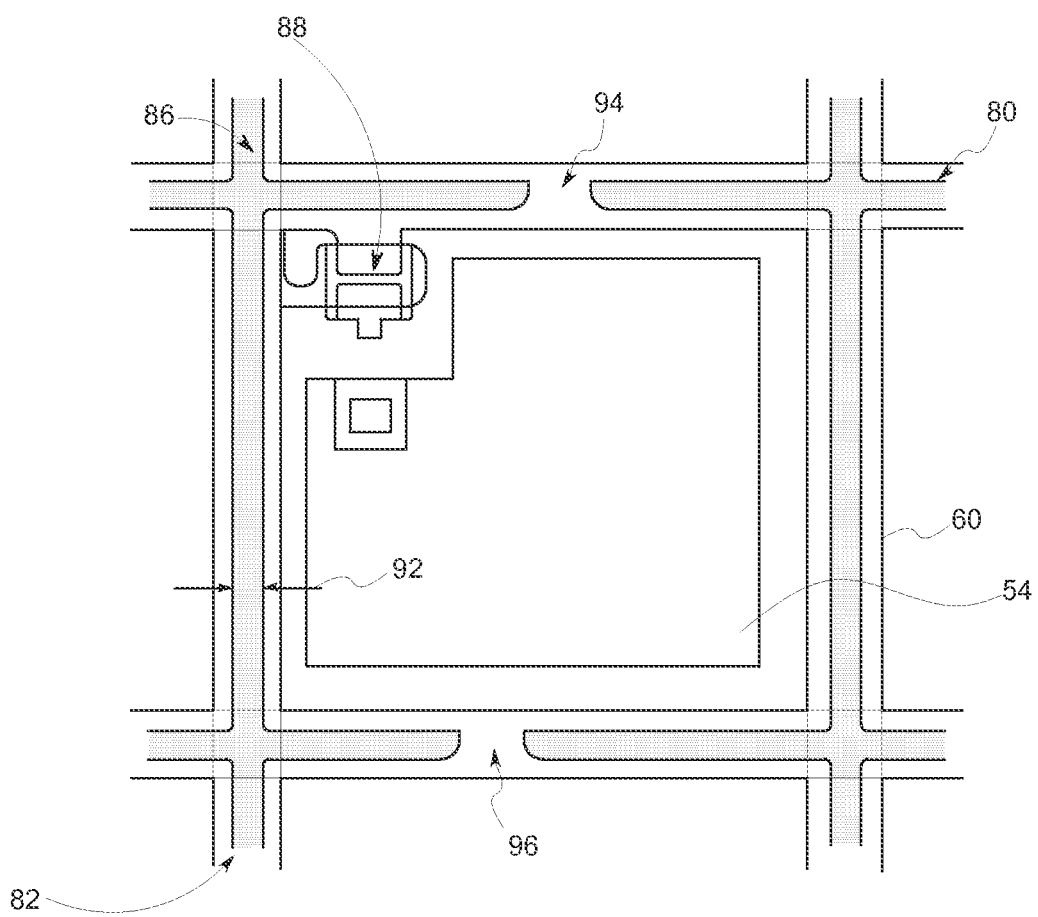
FIG. 8 is a top view of a portion of the photodetector assembly of FIG. 1 corresponding to one pixel.

As discussed above, the dielectric spacer 60 or the SAM 70 may facilitate patterning of the photodetector 42 and isolation of each pixel 41 from neighboring pixels within the TFT array 40. FIG. 8 is a top view of a portion 86 of the TFT array 40 corresponding to one pixel 41 of the photodetector assembly 12. The pixel 41 (e.g., portion 86) may include the first electrode 50 (e.g., a contact pad), and at least a portion of the second electrode 54. Similar to the first electrode 50, the second electrode 54 may be deposited as a thin film via physical vapor deposition, such as sputtering or any other suitable technique. In certain embodiments, a shadow mask may be employed during deposition of the second electrode 54 to define an array of second contact pads, corresponding to the second electrode 54, on each pixel 41 (e.g., portion 86) of the TFT array 40. The second contact pads may be fabricated onto the entire surface of each pixel 41 to increase the efficiency of the charge flow to the photodetector 42. The second electrode 54 may include transparent or semi-transparent conductive oxides. For example, in embodiments where the second electrode 54 is a cathode, materials such as, but not limited to, gold, silver, indium tin oxide (ITO), indium zinc oxide (IZO), aluminum zinc oxide (AZO), tin oxide, titanium oxide, any other suitable conductive metal oxide, or combinations thereof may be used. In embodiments where the second electrode 54 is an anode, materials such as, but not limited to, aluminum, gold, silver, platinum, ITO, IZO, zinc oxide, organic conductors (e.g., p-doped conjugated polymers), any other suitable material, or combinations thereof may be used.

The pixel 41 also includes the photodetector 42 disposed in between the first electrode 50 and the second electrode 54 and a TFT 88 aligned with the first electrode 50. Additional components of the pixel 41, such as, the gate, source, and drain of the TFT may be buried underneath the passivation layer 56 (not shown). In the illustrated embodiment, the dielectric spacer 60 overlaps with the data lines 80 and the scan lines 82. While in the illustrated embodiment a width 92 of the dielectric spacer 60 is constant around the portion 86, the dielectric spacer 60 may have a variable width. For example, in certain embodiments, the width 92 may be wider over the data lines 80 relative to the width 92 of the dielectric spacer 60 over the scan lines 82. Conversely, the width 92 may be wider over the scan lines 82 compared to the data lines 80. In other embodiments, the dielectric spacer 60 may only overlap with the data lines 80 or the scan lines 82. In other embodiments, the dielectric spacer 60 may not overlap with either of the data lines 80 or the scan lines 82. As discussed above, the pixel 41 (e.g., portion 86) may be surrounded by the dielectric spacer 60. In certain embodiments, the dielectric spacer 60 may form a contiguous boundary around the pixel 41. In other embodiments, the dielectric spacer 60 may surround only a portion of the pixel 41. For example, in the illustrated embodiment, the dielectric spacer 60 may include openings 94 and 96. The openings 94 may be positioned on a portion of the dielectric spacer 60 that is directly across from the opening 96. This configuration may facilitate continuous deposition of the second electrode 54 on the surface of the photodetector 42. While the illustrated embodiment depicts two openings opposite one another, the dielectric spacer 60 may include 1, 2, 3, 4, 5, 6, or more openings at any position along the dielectric spacer 60 depending on the configuration of the TFT array 40.

As described above, certain embodiments of the photodetector assembly 12 may include surrounding each pixel on the TFT array 40 with dielectric material (e.g., the dielectric spacer 60) or with self-assembled monolayers (e.g., SAM 70) to isolate each pixel from a neighboring pixel. Additionally, the dielectric material may border the TFT array 40 and surrounding pixels (e.g., dielectric border 72). The dielectric spacer 60, the dielectric border 72, and the SAM 70 may interrupt the continuous coating of the photodetector 42, and facilitate patterning of the photodetector onto each pixel and reduce the amount of photodetector 42 in peripheral regions of the TFT array 40. By separating each pixel from another pixel the performance and reliability of the photodetector assembly 12 may improve. Moreover, the dielectric border 72 or the SAM 70 (e.g., surrounding the TFT array) may allow removal of the photodetector 42 from the peripheral region 83 without damaging neighboring pixels.

Technical effects of the invention include a radiation detector (e.g., the photodetector assembly 12) having an OPD layer (e.g., the photodetector 42) patterned to correspond to pixels of an associated TFT layer (e.g., the TFT array 40). The radiation detector may be used in an imaging system, for example an optical and/or a medical imaging system, to detect incident radiation and generate an electrical signal in response to the detected radiation. The electrical signal may be processed by the imaging system to generate an image of an object.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A radiation detector assembly comprising:
   an organic photodetector configured to generate charge in response to an incident radiation;
   a thin film transistor array comprising a plurality of pixels, wherein the plurality of pixels are configured to produce electric signals corresponding to the charge generated by the organic photodetector; and
   a spacer disposed on the thin film transistor array, wherein the spacer surrounds one or more pixels and is configured to confine the organic photodetector within the surrounded one or more pixels such that the surrounded one or more pixels are electrically isolated from a neighboring pixel.

2. The radiation detector assembly of claim 1, wherein the spacer comprises an inorganic or organic dielectric material or combinations thereof.

3. The radiation detector assembly of claim 2, wherein the spacer comprises one or more separate and distinct layers of the dielectric materials.

4. The radiation detector assembly of claim 1, wherein the spacer comprises a self-assembled monolayer.

5. The radiation detector assembly of claim 1, wherein the spacer has a low surface energy.

6. The radiation detector assembly of claim 5, wherein the surface energy is approximately less than 30 mN/m.

7. The radiation detector assembly of claim 1, wherein the spacer comprises a dielectric material and a self-assembled monolayer, wherein the dielectric material is inorganic, organic, or a combination thereof.

8. The radiation detector assembly of claim 1, wherein the spacer comprises one or more openings configured to enable continuous deposition of an electrode on the surface of the photodetector.

9. The radiation detector assembly of claim 1, comprising a scintillator configured to generate optical photons in response to the incident radiation, wherein the optical photons are detected by the photodetector.

10. The radiation detector assembly of claim 1, wherein each pixel of the thin film transistor array is surrounded by the spacer.

11. A radiation detector assembly comprising:
an organic photodetector configured to generate charge in response to an incident light;
a thin film transistor array comprising a plurality of pixels, wherein the plurality of pixels are configured to produce electric signals corresponding to the charge generated by the organic detector; and
a spacer disposed along the plurality of pixels adjacent to a peripheral region of the thin film transistor array, wherein the spacer surrounds the plurality of pixels at least in one dimension and confines the organic photodetector to the thin film transistor array.

12. A method of manufacturing a radiation detector assembly comprising:
depositing a spacer around at least one pixel on a thin film transistor array; and
coating an organic photodetector onto at least a portion of the thin film transistor array, wherein the organic photodetector coating is constrained by the spacer such that the organic photodetector is not continuous between some pixels at least in one dimension.

13. The method of claim 12, wherein the spacer comprises an inorganic or organic dielectric material or a combination thereof.

14. The method of claim 12, wherein the spacer comprises a self-assembled monolayer.

15. The method of claim 12, wherein the spacer comprises a dielectric material and a self-assembled monolayer, wherein the dielectric material is inorganic, organic, or a combination thereof.

16. The method of claim 12, selectively removing a passivation layer disposed on the surface of the thin film transistor array to form the spacer.

17. The method of claim 12, wherein the spacer comprises two or more openings configured to receive an electrode.

18. The method of claim 12, modifying the surface of the spacer to create a low surface energy.

19. The method of claim 18, wherein the surface energy is approximately less than 30 mN/m.

20. A radiation detector system comprising:
a radiation detector assembly comprising:
an organic photodiode photodetector configured to generate charge in response to an incident radiation;
a thin film transistor array comprising a plurality of pixels, wherein the plurality of pixels are configured to produce electric signals corresponding to the charge generated by the photodetector; and
a spacer disposed on the thin film transistor, wherein the spacer surrounds at least one pixel and is configured to confine the organic photodetector within each surrounded pixel such that each surrounded pixel is electrically isolated from neighboring pixels; and
circuitry configured to process the electric signals produced by the plurality of pixels to reconstruct an image of an object to be imaged.

21. The radiation detector system of claim 20, wherein the spacer comprises an inorganic or organic dielectric material or combinations thereof.

22. The radiation detector system of claim 20, wherein the spacer comprises a self-assembled monolayer.

23. The radiation detector system of claim 20, wherein the spacer comprises a dielectric material and a self-assembled monolayer, wherein the dielectric material is inorganic, organic, or a combination thereof.

* * * * *